(12) United States Patent
Nojima (10) Patent No.: US 8,503,180 B2
(45) Date of Patent: Aug. 6, 2013

(54) VARIABLE FREQUENCY DRIVE SYSTEM APPARATUS AND METHOD FOR REDUCED GROUND LEAKAGE CURRENT AND TRANSISTOR PROTECTION

(75) Inventor: Geraldo Nojima, Duluth, GA (US)

(73) Assignee: SMC Electrical Products, Inc., Barboursville, WV (US)

( * ) Notice: Subject to any disclaimer, the term of this patent is extended or adjusted under 35 U.S.C. 154(b) by 232 days.

(21) Appl. No.: 12/159,544

(22) PCT Filed: Dec. 30, 2005

(86) PCT No.: PCT/US2005/047353
§ 371 (c)(1),
(2), (4) Date: Jun. 27, 2008

(87) PCT Pub. No.: WO2007/078285
PCT Pub. Date: Jul. 12, 2007

(65) Prior Publication Data
US 2008/0303469 A1    Dec. 11, 2008

(51) Int. Cl.
*H02H 5/04*    (2006.01)

(52) U.S. Cl.
USPC .................................... 361/707; 361/23

(58) Field of Classification Search
USPC .............. 361/43, 44, 47, 719, 753, 799, 762, 361/767, 23, 707; 324/551, 509, 545
See application file for complete search history.

(56) References Cited

U.S. PATENT DOCUMENTS

| | | | | |
|---|---|---|---|---|
| 4,768,075 A | * | 8/1988 | Broich et al. | 257/133 |
| 5,604,674 A | * | 2/1997 | Terasawa | 363/147 |
| 5,625,545 A | * | 4/1997 | Hammond | 363/71 |
| 5,940,579 A | * | 8/1999 | Kallgren et al. | 392/433 |
| 6,166,937 A | * | 12/2000 | Yamamura et al. | 363/141 |
| 6,370,767 B1 | * | 4/2002 | Solberg et al. | 29/840 |
| 6,462,412 B2 | * | 10/2002 | Kamei et al. | 257/723 |
| 7,154,753 B2 | * | 12/2006 | Kobayashi | 361/715 |
| 7,589,943 B2 | * | 9/2009 | Ramirez et al. | 361/35 |
| 2001/0048310 A1 | * | 12/2001 | Takahashi | 324/551 |

(Continued)

FOREIGN PATENT DOCUMENTS

EP    0924845 A2    6/1999

OTHER PUBLICATIONS

Mitic. G. et al., "AlSiC Composite Materials in IGBT Power Modules" Industry Applications Conference, 2000. Oct. 8, 2000, vol. 5. pp. 3021-3027. Piscataway, NJ, USA. XP0105 21717.

*Primary Examiner* — Danny Nguyen
(74) *Attorney, Agent, or Firm* — Sughrue Mion, PLLC (57) ABSTRACT

As applications of variable frequency drives (VFD) (50) continue to grow so do challenges to provide VFD (50) systems meeting application specific requirements. For multiple reasons to include safety standards and electromagnetic interference, reduced ground leakage current is desirable. Building high output voltage VFDs (50) using transistors rated at voltages lower than the VFD output voltage is desireable for economic reasons. The apparatus and method described herein meet these challenges and others, in part by placing an electrically insulating plate (cp176) having high thermal conductivity, a low dielectric constant, and high dielectric strength between the heat sink plate of a VFD power semiconductor module and a grounded cooling plate (80 TE). The positive effects of this plate installation include reducing ground leakage current induced by system capacitances to ground upon high frequency voltage steps and increasing the effective dielectric strength of the VFD's (50) transistor modules engaging in high reliable VFD (50) voltage output for a given transistor rating.

9 Claims, 6 Drawing Sheets

U.S. PATENT DOCUMENTS

| | | | |
|---|---|---|---|
| 2003/0189432 A1* | 10/2003 | Montreuil | 324/649 |
| 2004/0136208 A1* | 7/2004 | Agarwal et al. | 363/21.12 |
| 2005/0057901 A1* | 3/2005 | Obu et al. | 361/717 |
| 2005/0270806 A1* | 12/2005 | Zhu | 363/17 |
| 2006/0234767 A1* | 10/2006 | Nishikawa et al. | 455/556.1 |
| 2007/0048561 A1* | 3/2007 | Aiello et al. | 429/13 |
| 2007/0121269 A1* | 5/2007 | Laakso et al. | 361/118 |

\* cited by examiner

VARIABLE FREQUENCY DRIVE SYSTEM APPARATUS AND METHOD FOR REDUCED GROUND LEAKAGE CURRENT AND TRANSISTOR PROTECTION

BACKGROUND OF THE INVENTION

Conventional sinusoidal AC voltage supplies provide only fixed motor speed and are unable to respond quickly to changing load conditions. With the advent of variable frequency drives (VFDs), a better performing motor at lower energy costs can be achieved. VFD driven motors rapidly respond to changing load conditions, for example in response to shock loads. VFD driven motors provide precision torque output and continuous speed control, as well. Because of their many advantages, the utilization of VFDs in industrial applications continues to grow.

A conventional medium voltage VFD driven motor system is described below with reference to FIG. 1. The neutral point N 26 of the DC bus 20 is grounded to protect the transistor switches from potential voltage spikes that would cause insulation degradation and component failure. The heat sink plate of transistors in the inverter bridge is also grounded, however, the ground connection is not shown in FIG. 1. FIG. 2A illustrates grounding of the inverter bridge transistor module via the heat sink plate 126 and is described below in greater detail. Again referencing FIG. 1, three phase cables 30 are connected at one end to the output terminals 52 of the VFD 50. Cables 30 have an inherent capacitance per unit length. The total cable capacitance is shown as $C_C$ 32. These cables feed the motor M 40, which also has capacitance due to windings, shown as $C_M$ 42, and motor impedance shown as $Z_M$ 44.

Figure 1:
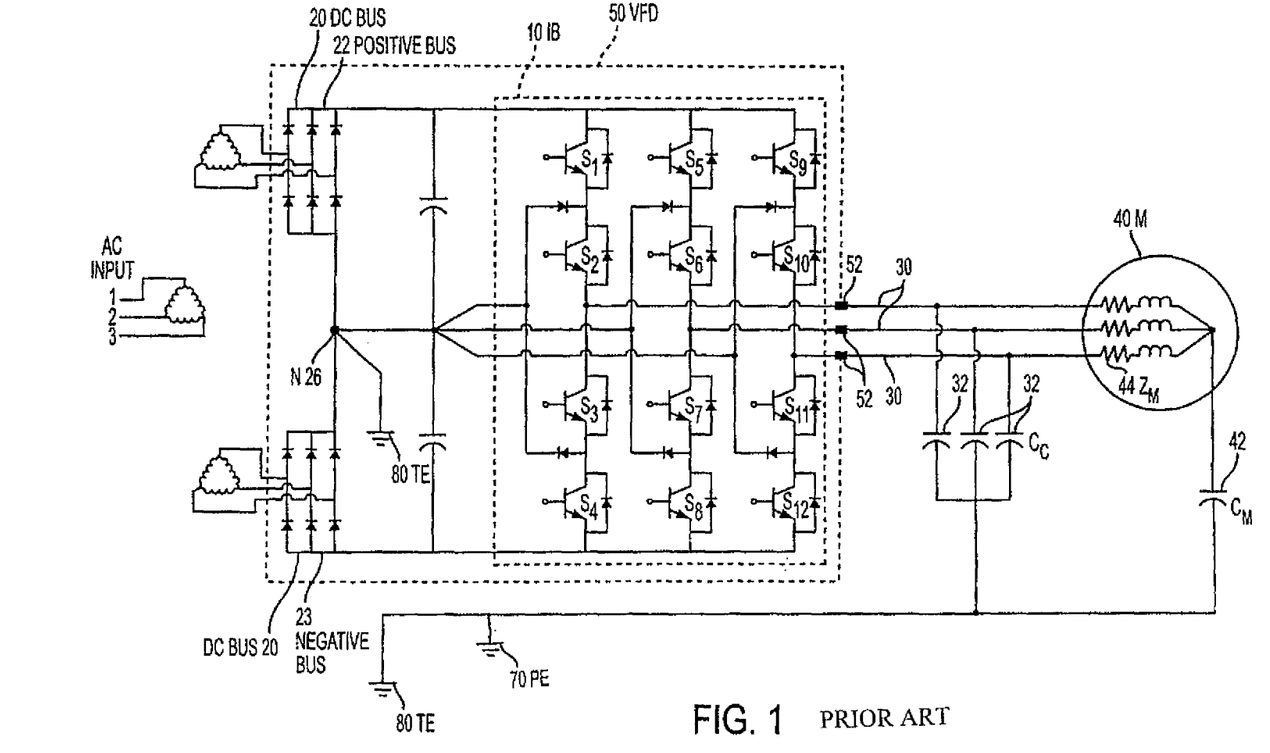
FIG. 1 shows a conventional VFD driven motor system.
Figure 2A:
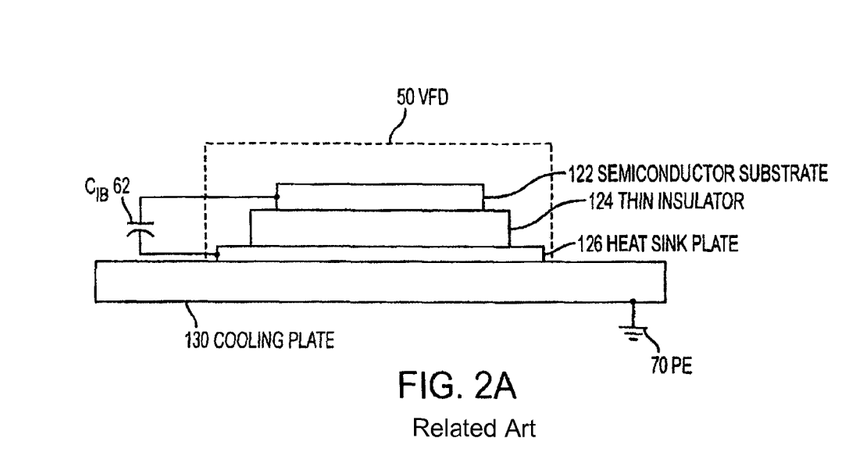
FIG. 2A shows grounding of an inverter bridge across the transistor module's insulating plate and resulting inverter bridge capacitance, according to a conventional VFD system.
Figure 3A:
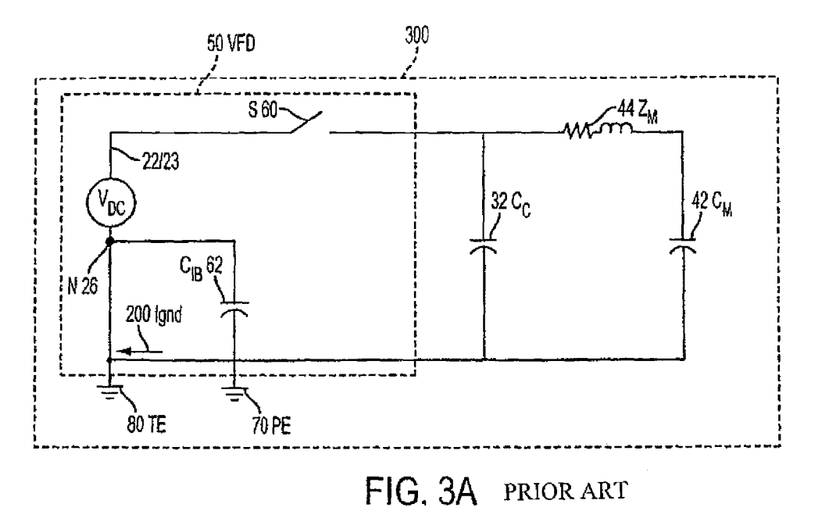
FIG. 3A shows a schematic representation of a ground current loop in a conventional VFD system, as shown for example in FIG. 1, to include the capacitance of the inverter bridge.

FIG. 3A is a schematic circuit 300 representation of a conventional VFD driven motor system, for example the drive system shown in FIG. 1. Switch S 60 represents the voltage transitions output from the VFD 50. Upon closing of switch S 60, a voltage transition, from grounded neutral to the positive 22 or negative 23 potential on the DC bus 20, output from the VFD 50 is imposed upon the circuit 300. Ground leakage current $I_{GND}$ 200 flows freely in the ground connection with the voltage transitions due to the motor capacitance $C_M$ 42 and the cable capacitance $C_C$ 32. Inverter bridge capacitance, $C_{IB}$ 62, is connected from the neutral point N 26 to equipment ground PE 70 and to true earth ground TE 80 in parallel with the short circuit of the neutral point N 26 connection to true earth ground TE 80. In this conventional configuration because $C_{IB}$ 62 is in parallel with the short circuit connection to ground, $C_{IB}$ 62 contributes negligibly to ground leakage current.

Because of their high performance and lower power consumption, VFDs are desirable in a variety of demanding applications, to include fan and pump loads. However, use of VFDs in medium voltage applications can be complicated if low ground leakage current is necessary. Low ground leakage current can be necessary in potentially explosive environments or in environments requiring reduced electromagnetic interference (EMI). High frequency ground leakage currents, up to the MHz range can lead to EMI, for example in radio receivers, computers, bar code systems, and vision systems.

One example of an application requiring low ground leakage current is underground mining; the underground mining environment has unique requirements and safety standards. Underground mining motors are preferably in the medium voltage range (between 690 V and 15 kV) and are typically driven at 4,160 V. A conventional medium voltage VFD providing a 4,160 V output can yield a ground leakage current $I_{GND}$ 200 in excess of ten amps, which flows from the VFD 50 to the motor M 40 in the grounding wire. While using a medium voltage motor facilitates the use of smaller cables, the maximum permitted drive to motor ground wire leakage current $I_{GND}$ 200 can be below 1 Amp.

Figure 3B:
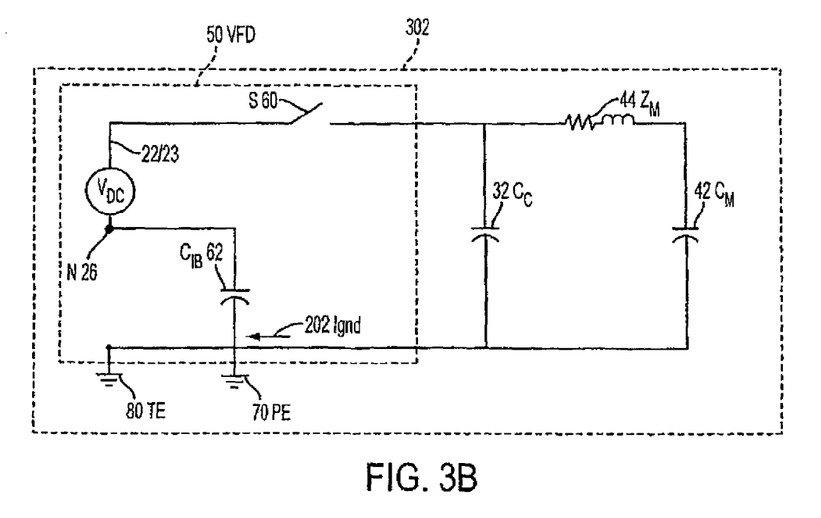
FIG. 3B shows a schematic representation of a VFD system having a floating neutral point on the DC bus in the absence of the present invention.

Unlike conventional AC sinusoidal motor drives, VFDs output voltage transitions on the time order of microseconds. Consequently, large ground leakage currents are induced due to capacitances $C_M$ and $C_C$, inherent in a VFD driven motor system, even at relatively low voltages, for example 690 volts. Referring to FIG. 3A, disconnecting the neutral point N 26 of the DC bus 20 from TE ground 80 appears to be a viable means of reducing ground leakage current. A schematic representation of disconnecting the neutral point N 26 from ground in a conventional VFD system 302 is shown in FIG. 3B. As shown in FIG. 3B, disconnecting the neutral point N 26 of the DC bus from TE ground 80 changes the circuit model for ground current leakage current, $I_{GND}$ 202. Inverter bridge capacitance, $C_{IB}$ 62, is now in series with the parallel combination of cable capacitance $C_C$ 32 and motor capacitance $C_M$ 42. This results in higher impedance for the ground leakage current due to the decrease in total system capacitance. However, disconnection of the neutral point N 26 from TE ground 80 leaves transistors $S_1$-$S_{12}$ in the inverter bridge susceptible to voltage spikes.

Disconnecting the neutral point N 26 of the DC bus from TE ground 80, leaves the transistors floating relative to the neutral point N 26 of the DC bus. Voltage spikes at full DC bus potential can be applied across the transistors in the inverter bridge. Referring to FIG. 2A, these voltage spikes are transmitted between the transistors' semiconductor substrate 122 and the transistors' heat sink plate 126 across thin insulator 124.

For lower drive voltages, available transistors rated above the difference between the positive and negative DC bus can be employed in a VFD system having the neutral point of the DC bus disconnected from TE ground and left floating. This configuration is successfully employed for example in SMC's Microdrive 2,300 V model[1]. However, when higher VFD voltage output is needed or desired and when transistors rated at the full DC bus potential are not practical, protecting transistors from full DC bus potential spikes is necessary to prevent reduced component life and component failure. Multiple challenges exist for VFD drive applications. One challenge, for example, is to reduce leakage ground current while protecting the VFD, in particular the inverter bridge. Another challenge is to reduce ground leakage current as much as possible.

[1] VFD, Microdrive, 2,300V model, SMC Electrical Products, 2003.

For other applications, the challenge is to provide a reliable VFD system for motors rated at greater than 4160 V. For, example for a motor rated at greater than 4160 V, a VFD providing an output of 6.9 kV output is desirable. However, presently available transistors to build a VFD with a 6.9 kV output are susceptible to compromised transistor insulation and impending component failure. A DC bus rated at 11.5 kV is needed to achieve a VFD output of 6.9 kV. Inverter bridge transistors are available at an insulation rating of 5,100 V. Even when the neutral point of the DC bus is grounded, the transistor module insulation 124 (FIG. 2A) breakdown voltage (5,100 V) is less than half the potential on the DC bus (11.5 kV). Yet another challenge in VFD systems is to protect the inverter bridge comprising available transistors connected in series to provide VFD output voltages greater than 4160 V when transistors are rated at less than half of the DC bus voltage.

US 8,503,180 B2

SUMMARY OF THE INVENTION

The present invention provides decreased ground leakage current in a VFD driven motor system, while protecting the inverter bridge.

It is an object of the present invention to reduce ground leakage current in a VFD driven motor system.

It is another object of the present invention to reduce the ground leakage current by floating the neutral point of the DC bus.

It is another object of the present invention to float the neutral point of the DC bus while protecting the VFD from component failure due to voltage spikes.

It is another object of the present invention to increase the impedance for ground leakage currents.

It is another object of the present invention to further reduce ground leakage current in a medium voltage VFD driven motor system without decreasing system capacitance to ground.

It is another object of the present invention to decrease the total capacitance to ground of a VFD motor driven system.

It is another object of the present invention to decrease the total capacitance to ground of a VFD motor driven system by means of a high dielectric strength and low dielectric constant plate disposed between the VFD transistor module heat sink plate and a grounded cooling plate.

Another object of the present invention is to improve inverter bridge reliability and component life in a VFD system having transistors rated at less than half of the full DC bus potential by means of additional effective insulation when the neutral point of the DC bus in the VFD is grounded.

Exemplary embodiments of the present invention can be used in low, medium, and high voltage drive applications.

In accordance with the objects of the present invention, in an apparatus according to an exemplary embodiment of the present invention, the neutral point of the DC bus is floating, disconnected from ground.

In an apparatus according to another exemplary embodiment, an electrically insulating plate having high thermal conductivity, high dielectric strength, and a low dielectric constant is thermally and electrically connected between the transistor semiconductor substrate and the cooling plate.

In an apparatus according to another exemplary embodiment, a common mode filter is installed at the output of the VFD.

A method in accordance with an embodiment of the present invention comprises floating the neutral point of the DC bus and increasing the impedance of the ground leakage path by means of a dielectric substrate.

Another method in accordance with an embodiment of the present invention comprises increasing the impedance of the ground leakage path by means of a dielectric substrate and also increasing the dielectric strength of the transistor module of the VFD to greater than the full DC bus voltage.

Another method in accordance with another embodiment of the present invention comprises floating the neutral point of the DC bus, increasing the impedance of the ground leakage path by means of a dielectric substrate, and installing a common mode filter across the three phase drive cables in a VFD system.

Other objects and advantages of the present invention will become apparent to one skilled in the art from the following description in view of the accompanying drawings.

BRIEF DESCRIPTION OF THE DRAWINGS

FIG. 4 shows a schematic representation of a ground current loop in a VFD system implementing an exemplary embodiment of the present invention, showing the capacitance of the transistor module and the capacitance of the low dielectric constant insulating plate.

DETAILED DESCRIPTION OF THE DRAWINGS

The present invention reduces ground leakage current by allowing the neutral point N of the DC bus to float without exposing the transistors in the inverter bridge to excessive voltage spikes.

Turning first to FIG. 2A, the conventional grounding of an inverter bridge in a transistor module is shown. Grounding of the inverter bridge is via the transistor module's heat sink plate 126. A capacitance $C_{IB}$ 62 is formed between the semiconductor substrate 122 and the heat sink plate 126 across the thin insulating plate 124. The semiconductor substrate 122, the thin insulating plate 124, and the heat sink plate 126 collectively form a conventional VFD power semiconductor module, also commonly referred to as a VFD transistor module. The heat sink plate 126 is then mounted on and electrically connected to the grounded cooling plate 130.

Figure 2B:
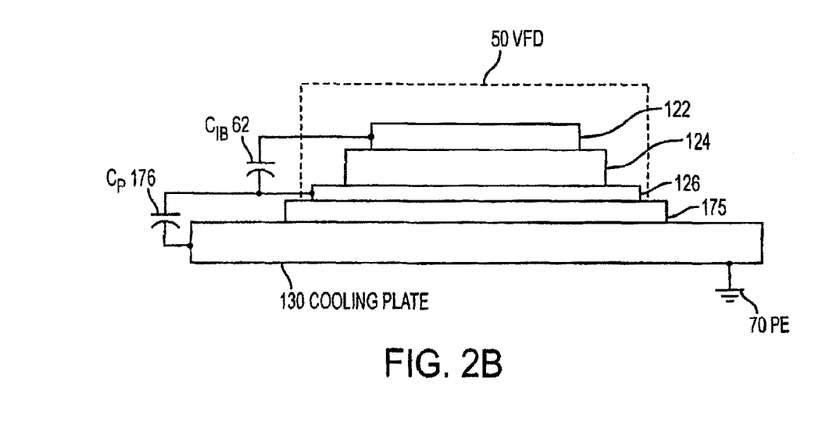
FIG. 2B shows the series connection of the inverter bridge to ground across the transistor module's insulating plate, the module's heat sink plate, and the electrically insulating, high dielectric strength, low dielectric constant, and high thermal conductivity plate according to an embodiment of the present invention.

FIG. 2B shows grounding of an inverter bridge in accordance with an exemplary embodiment of the present invention. The transistor module's semiconductor substrate 122, insulating plate 124 and heat sink plate 126 are connected together as in the conventional grounding means of FIG. 2A. However, according to an exemplary embodiment, an electrical insulator plate P 175 having high dielectric strength, low dielectric constant, and high thermal conductivity is mounted between the heat sink plate 126 and the grounded cooling plate 130. The heat sink plate is typically made of aluminum silicon carbide. However, the heat sink plate 126 need not be made of aluminum silicon carbide; a material providing good electrical conduction and thermal conduction would be an adequate substitute.

Figure 4:
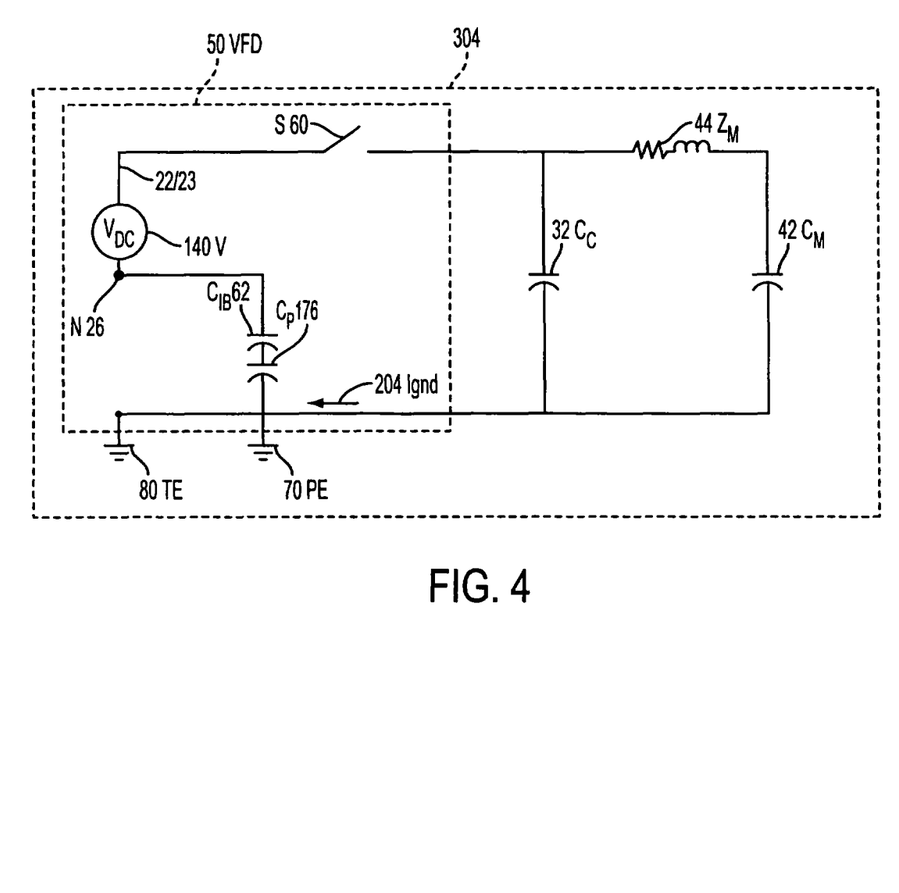

The inverter bridge semiconductor substrate 122 is thermally connected to and electrically insulated from the cooling plate 130 via plate P 175. Because the dielectric constant of insulating plate P is low, a small capacitance $C_P$ 176 is formed between the transistor module's heat sink plate 126 and the cooling plate 130. This capacitance is smaller than and is in series with the transistors internal capacitor $C_{IB}$ 62 (FIGS. 2A, 2B, and 4). Capacitance $C_{IB}$ 62 is a byproduct of the capacitive coupling between the semiconductor substrate surface 122 and the transistor heat sink plate 126, which are insulated from each other with the thin insulator 124, as shown in FIG. 2A.

Referring to FIG. 3A, in the conventional inverter bridge, grounding the neutral point N 26 of the DC bus 20 and grounding one end of $C_{IB}$ 62 to the same TE ground 80 creates a path to the DC Bus for displacement currents generated at every pulse transition. This grounding prevents one transistor from affecting another transistor in the inverter bridge. More particularly, removal of the neutral point N 26 grounding of the DC bus 20 causes one side of $C_{IB}$ 62 to be floating relative to the neutral point N 26 of the DC bus, as shown in FIG. 3B, which allows displacement current crosstalk between transistors in the inverter bridge via respective transistor capacitances, $C_{IB}$ 62, which are interconnected via cooling plate 130. This crosstalk can cause excessive voltage spikes between the transistor module's semiconductor substrate 122 and its heat sink plate 126 that can lead to component failure.

It is known by those skilled in the art that modular or isolated base high voltage IGBT transistors require the neutral point of the DC bus to be grounded. Such grounding ensures that the maximum voltage between the transistor terminals and the cooling plate is no more than half of the maximum DC bus voltage. If the neutral point is disconnected from ground, the capacitor, which is formed between the transistor module's semiconductor substrate and its heat sink plate, $C_{IB}$ is still grounded on the cooling plate 130 side. The inverter bridge capacitance is now, floating relative to the DC bus positive and negative voltages 22/23 and is electrically connected to the other transistors' internal capacitances, $C_{IB}$ 62, in the inverter bridge via the grounded cooling plate 130. When the transistors which are attached to the positive voltage of the DC bus are turned off, the semiconductor substrate is connected directly to the positive voltage of the DC bus. Then, when the transistors connected to the negative voltage are turned on, this causes internal transistor capacitances, $C_{IB}$ 62, to be charged at the negative voltage potential of the DC bus. Because one side of all of the transistors' respective internal capacitors, $C_{IB}$ 62, are connected together, the semiconductor substrate of the transistors connected to the positive voltage are subjected to the full DC bus voltage. In the typical case, the full DC bus voltage is substantially higher than the transistor's insulation voltage rating and damage to the transistor occurs.

FIG. 4 shows a schematic representation 304 of an exemplary embodiment of a VFD system according to the present invention incorporating an insulating plate P 175, as shown for example in FIG. 2B. The insulator plate capacitance $C_P$ 176 is now in series with $C_{IB}$ 62. The insulator plate capacitance, $C_P$ 176 is connected to the TE grounded cooling plate 130. The series capacitance of $C_{IB}$ and $C_P$ provides higher impedance for the return path to the voltage source V 140, decreasing ground leakage current $I_{GND}$ 204. The insulating plate P 175 (FIG. 2B) also serves to increase the insulation strength between the cooling plate and the power semiconductor. Total system capacitance $C_{SYS}$ is decreased as described by equations 1 and 2 corresponding to the circuit shown in FIG. 4. First, in equation 1, we define the capacitance of the VFD, $C_{VFD}$.

$$C_{VFD} = \frac{(C_P * C_{IB})}{(C_P + C_{IB})} \tag{1}$$

$$C_{SYS} = \frac{((C_C + C_M) * C_{VFD})}{(C_C + C_M + C_{VFD})} \tag{2}$$

The decrease in total system capacitance $C_{SYS}$ in turn reduces the ground leakage current $I_{GND}$ 204 from the voltage transitions at the output of the VFD according to equation 3.

$$I' = C_{SYS} * \left(\frac{dV}{dt}\right) \tag{3}$$

The following experimental data shown in Tables 1 and 2 was obtained in the presence and absence of an exemplary embodiment of the present invention and confirms the effectiveness thereof. Table 1 summarizes the data obtained under control conditions. The VFD module is a 4160 V output Microdrive (SMC Electrical Products, U.S. Pat. No. 6,822,866). The motor is a 500 HP induction motor rated at 4000 V or less. Ground current measurements were made for three phase shielded cable lengths of 30, 250, and 1300 feet. Ground current was continuously measured at the output terminals of the VFD and at the motor. The VFD was switching at 1 kHz, and the motor speed was maintained at 30 percent. Control measurements could not be made with the neutral point N of the DC bus disconnected from ground and floating in the absence of an insulating plate P 175, as depicted in FIG. 3B. Disconnecting the neutral point N from ground left the transistors of the inverter bridge only protected by thin insulator 124, resulting in component failure due to crosstalk, as expected and as discussed above. A 1.5 µF capacitor was connected in series from the neutral point N to ground and in parallel with $C_{IB}$, to serve as a very high impedance path, providing more protection than an open circuit. The 1.5 µF capacitor provides a high impedance path for the neutral point to ground without sacrificing the inverter bridge. Table 1 summarizes the control data obtained without the insulating plate P 175. Current values in Tables 1-3 are RMS.

TABLE 1

GROUND CURRENT MEASUREMENTS FOR
30, 250, and 1300 ft. CABLES (Amps)
Without Boron Nitride Plate

|  | 30' | 250' | 1300' |
|---|---|---|---|
| @Drive | 4.7 | 8.0 | 38.3 |
| @Motor | 2.3 | 2.0 | 3.7 |

Figure 6:
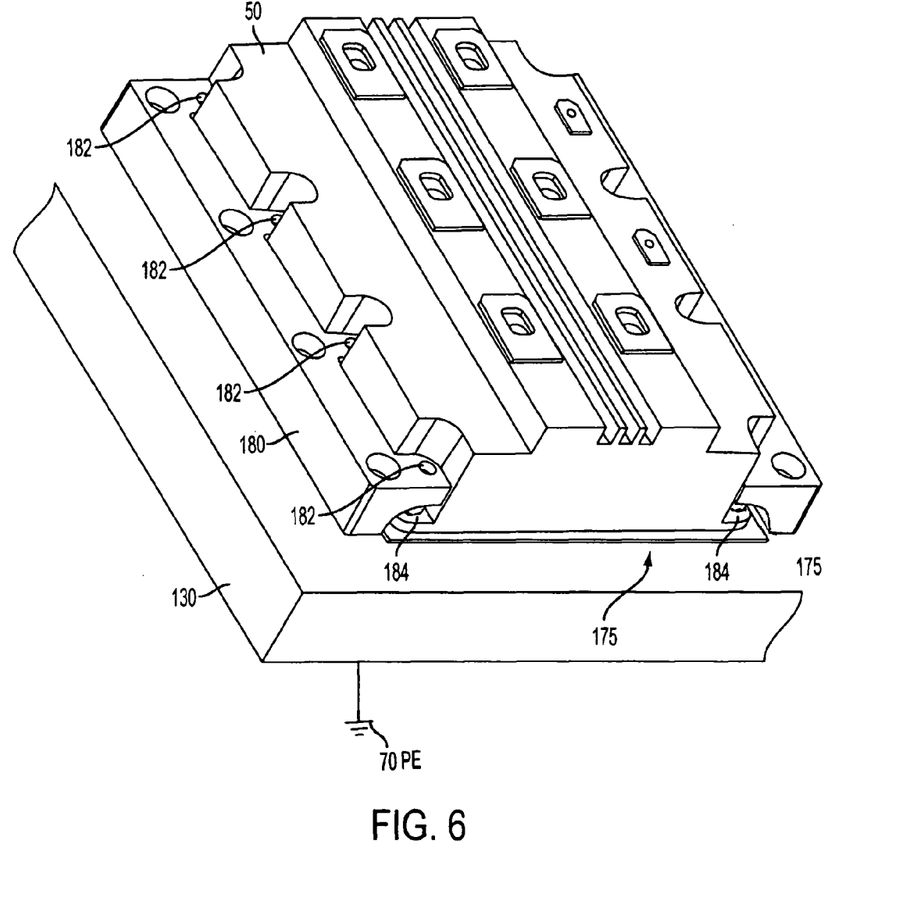
FIG. 6 shows an exemplary embodiment of a mounting means which enables electrical insulation and thermal conduction between the VFD power semiconductor module and the grounded cooling plate and secures the VFD power semiconductor module to the insulating plate and secures the insulating plate to the grounded cooling plate.

Table 2 summarizes experimental data obtained using an exemplary embodiment of the present invention. The test conditions were the same as those of the control conditions, above, with the following test modifications. An insulating plate P 175 was installed between the heat sink plate 126 and the cooling plate 130 (as shown in FIGS. 2B and 6). The neutral point N of the DC bus was disconnected from ground and floating. In this exemplary test embodiment, the insulating plate P is ceramic made from boron nitride. FIG. 4 is a schematic representation of the test conditions summarized in Table 2.

TABLE 2

GROUND CURRENT MEASUREMENTS FOR
30, 250, and 1300 ft. CABLES (Amps)
WITH Boron Nitride Plate

|  | 30' | 250' | 1300' |
|---|---|---|---|
| @Drive | 0.7 | 1.1 | 5.5 |
| @Motor | 0.5 | 0.3 | 0.4 |

Figure 5:
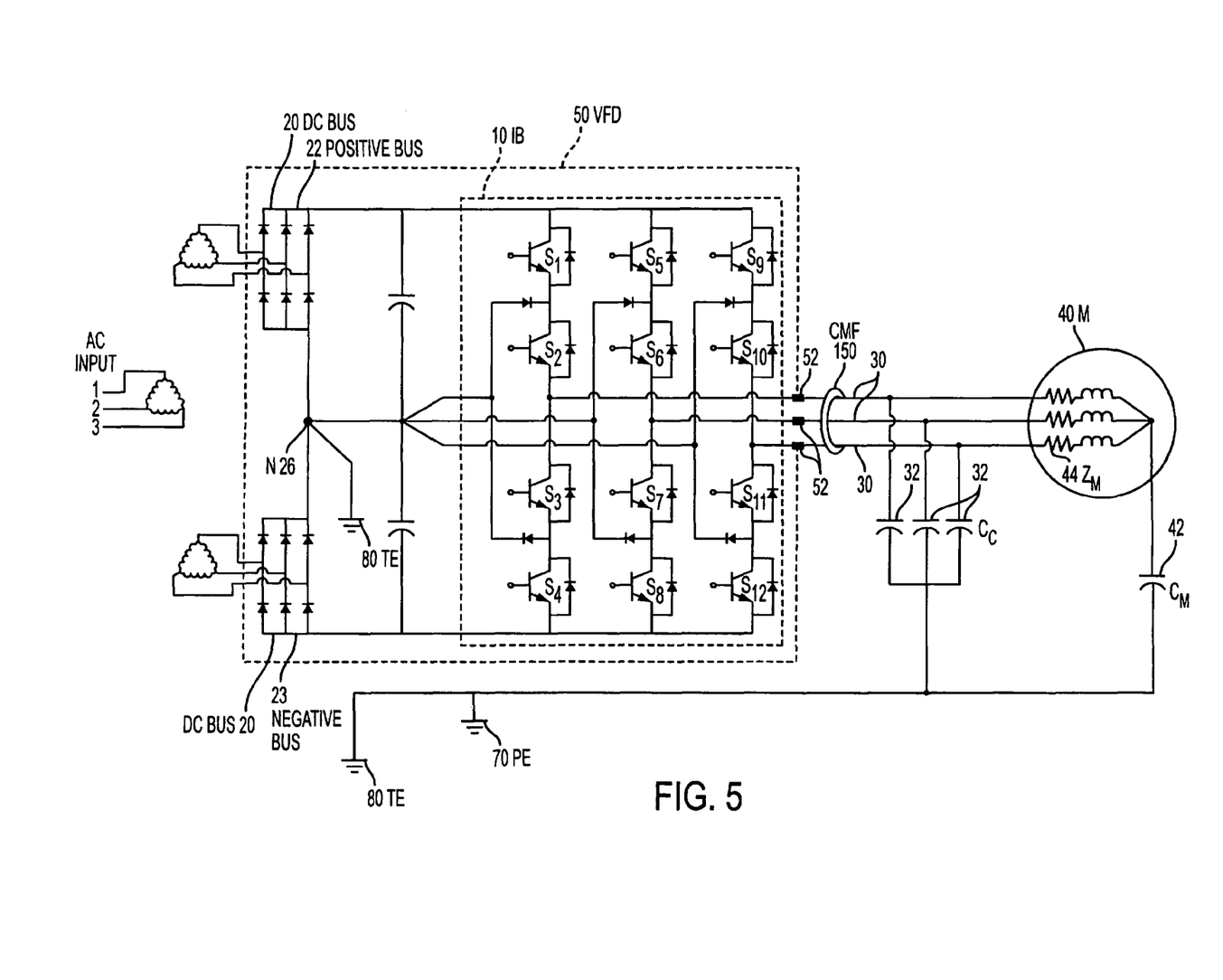
FIG. 5 shows another exemplary embodiment of the present invention comprising a common mode filter installed on the three phase drive cables.

Additional experimental measurements were made for the system according to another exemplary embodiment, comprising a common-mode filter (CMF 150), shown for example in FIG. 5. The CMF 150, transformer and resistor ballast, is installed across the three phase cables connecting the VFD output to the motor. Acquisition of the data below in Table 3 was made with a 500 HP induction motor running at 50 percent of full speed. All other test conditions were the same as those employed to acquire the test data summarized in Table 2. The VFD was switching at frequency of 1 kHz. Ground current measurements were made at the output terminals of the VFD and at the motor. Current values shown are RMS, as above.

TABLE 3

GROUND CURRENT MEASUREMENTS 250 ft CABLES (Amps)
WITH Boron Nitride Plate

|  | No CMF | CMF |
|---|---|---|
| @Drive | 5.2 | 0.05 |
| @Motor | 0.8 | 0.05 |

As seen from the data in Table 3, above, ground leakage current is reduced to a negligible amount, 50 mA, with installation of the boron nitride ceramic plate and the CMF according to another exemplary embodiment of the present invention.

While boron nitride plates were used in the exemplary embodiments for experimental data acquisition described above, other oxide and nitride materials or other insulating substances that have the desired dielectric and thermal properties described according to the present invention can be used. For example, synthetic diamond plates can be used which have the desired dielectric properties and excellent thermal conduction.

Installation of the insulation plate 175, as shown in FIG. 2B, also provides another object of the present invention, which is to enable the use of transistors rated at less than half of the full DC bus potential in building a reliable VFD system with the neutral point of the DC bus grounded. For example, for a motor rated at greater than 4160 V, a VFD providing an output voltage greater than 4160 V, for example 6.9 kV, is desirable. DC buses rated at 11.5 kV are readily available for use in VFDs and are adequate to provide a VFD output of 6.9 kV. Transistors to build the inverter bridge are readily available at a rating of 5,100 V. Even when the neutral point is grounded, the transistor insulation (i.e., element 124 in FIG. 2A) breakdown voltage (5100 V) is less than half the full potential on the DC bus 11.5 kV. Installation of insulating plate P 175, as shown in FIG. 2B, with sufficient dielectric strength as described above, increases the effective insulation of the inverter bridge transistors analogous to the effect of $C_P$ in series with $C_{IB}$ versus $C_{IB}$ alone. The increased insulation improves component life and system reliability. Therefore, installation of the insulation plate P 175 enables multiple transistors to be connected in series (shown for example in FIGS. 1 and 5, S1-S12) and cooled by a common cooling plate 130 (shown for example in FIG. 2B) to achieve a higher output voltage VFD system at low cost using presently available transistors, rated at below half the full DC bus voltage, while maintaining the benefits of a single grounded cooling plate.

FIG. 6 shows an exemplary embodiment of a mounting means which enables electrical insulation and thermal conduction between the VFD power semiconductor module 50 and the grounded cooling plate 130 and secures the power semiconductor to the insulating plate 175 and secures the insulating plate to the grounded cooling plate 130. The VFD power semiconductor module 50 (also shown in FIGS. 2A and 2B) is securely mounted on the insulating plate 175, which is securely mounted on the grounded cooling plate 130 by means of L shaped steel brackets 180. Brackets 180 are fastened directly to the cooling plate 130 on one end and secure the VFD power semiconductor module via set screws 182 and ceramic pellets 184 on the other end.

FIG. 6 shows only one exemplary embodiment of many possible means for securing the VFD power semiconductor module and the insulation plate to the cooling plate. The bracket can be made from any material having sufficient strength to support the clamping forces required by the transistor module specifications. One ordinarily skilled in the art will readily appreciate the various ways of physically securing the VFD power semiconductor module to the insulating plate and the insulating plate to the cooling plate while permitting the electrical insulation and thermal conduction capacities of the insulation plate to be realized.

In summary, reduction of ground leakage current in a VFD system is desirable for multiple reasons in numerous application environments. An electrical insulator plate having high dielectric strength, low dielectric constant, and high thermal conductivity mounted between the VFD power semiconductor module and the grounded cooling plate is an effective means of reducing system capacitance thereby reducing ground leakage currents induced with the high frequency voltage shifts of a VFD. Installation of the insulator plate described above protects the transistors in the inverter bridge from insulation breakdown by increasing the insulation between the VFD power semiconductor module and ground.

While the present invention has been particularly shown and described according to exemplary embodiments herein, it will be understood by those skilled in the art that various changes can be made in form or detail without departing from the spirit and scope of the invention as defined by the following claims.

What is claimed is:

1. A method of increasing dielectric strength of a power semiconductor in a variable frequency drive (VFD) system comprising:
   disposing an electrically insulating plate which has high thermal conductivity, a low dielectric constant, and high dielectric strength, an insulator and a heat sink between a VFD power semiconductor module and a cooling plate;
   wherein an output voltage of said VFD is greater than or equal to 690 V.

2. A variable frequency drive (VFD) system comprising:
   an inverter bridge, of a VFD power semiconductor module, electrically connected to the DC bus;
   an electrically insulating plate which has high thermal conductivity, a low dielectric constant, and high dielectric strength; and
   a cooling plate wherein the VFD power semiconductor module is mounted on an insulator, a heat sink and on the electrically insulating plate, having high thermal conductivity, a low dielectric constant, and high dielectric strenght;
wherein the insulating plate is mounted on the cooling plate;
wherein the cooling plate is grounded and
wherein an output voltage of said VFD is greater than or equal to 690 V.

3. The VFD system according to claim 2, wherein the insulating plate is a ceramic material.

4. The VFD system according to claim 2, wherein the insulating plate is made of boron nitride.

5. The VFD system according to claim 2,
wherein a capacitance is formed across the electrically insulating plate between the VFD power semiconductor module and the cooling plate, and
wherein said capacitance between the VFD power semoconductor module and the cooling plate is less than inverter bridge transistor internal capacitance to ground, and a total capacitance to ground of the VFD system is reduced.

6. The VFD system according to claim 2, further comprising at least one mounting device which enables electrical insulation and thermal conduction between the VFD power semiconductor module and the grounded cooling plate and secures the VFD power semiconductor to the insulating plate and secures the insulating plate to the grounded cooling plate.

7. A variable frequency drive (VFD) system comprising:
a DC bus which has a grounded neutral point; and
VFD power semiconductor modules, wherein
transistor modules of an inverter bridge are connected in series, the inverter bridges is electrically connected to the DC bus, and an insulation of transistor modules is rated at less than half of a full maximum DC bus voltage rating;
an electrically insulating plate which has high thermal conductivity, a low dielectric constant, and high dielectric strength; and
a grounded cooling plate, wherein the VFD power semiconductor module is mounted on an insulator, a heat sink and on the electrically insulating plate, having high thermal conductivity, a low dielectric constant, and high dielectric strength;
wherein the insulating plate is mounted on the grounded cooling plate;
wherein an effective insulation capability to ground of the VFD system is increased, and
wherein an output voltage of said VFD is greater than or equal to 690 V.

8. The method according to claim 1, wherein said output voltage of said VFD is greater than or equal to 4160 V.

9. The VFD system according to claim 2, wherein said output voltage of said VFD is greater than or equal to 4160 V.

* * * * *